(12) United States Patent
Nakamura et al.

(10) Patent No.: US 7,741,932 B2
(45) Date of Patent: Jun. 22, 2010

(54) TORSIONAL RESONATOR AND FILTER USING THIS

(75) Inventors: Kunihiko Nakamura, Kanagawa (JP); Hideki Kawakatsu, Tokyo (JP)

(73) Assignee: Panasonic Corporation, Osaka (JP)

( * ) Notice: Subject to any disclaimer, the term of this patent is extended or adjusted under 35 U.S.C. 154(b) by 540 days.

(21) Appl. No.: 11/569,883

(22) PCT Filed: Jul. 22, 2005

(86) PCT No.: PCT/JP2005/013502
§ 371 (c)(1), (2), (4) Date: Dec. 1, 2006

(87) PCT Pub. No.: WO2006/013741
PCT Pub. Date: Feb. 9, 2006

(65) Prior Publication Data
US 2009/0224850 A1    Sep. 10, 2009

(30) Foreign Application Priority Data
Aug. 5, 2004   (JP)   .............................. 2004-229666

(51) Int. Cl.
H03H 9/125    (2006.01)
H03H 9/52     (2006.01)
(52) U.S. Cl. .................... 333/186; 310/309; 333/200
(58) Field of Classification Search ................. 333/186, 333/200; 310/309
See application file for complete search history.

(56) References Cited

U.S. PATENT DOCUMENTS 3,490,056 A * 1/1970 Warren et al. ............... 333/186
3,634,787 A * 1/1972 Newell ....................... 333/186
4,137,511 A * 1/1979 Jones ......................... 333/186

FOREIGN PATENT DOCUMENTS

JP    2002-535865    10/2002

OTHER PUBLICATIONS

A. Olkhovets et al.; "Actuation and Internal Friction of Torsional Nanomechanical Silicon Resonators"; Journal of Vacuum Science and Technology B, vol. 18, Issue 6, pp. 3549-3551, Nov. 2000; American Vacuum Society.*

(Continued)

*Primary Examiner*—Barbara Summons
(74) *Attorney, Agent, or Firm*—Pearne & Gordon LLP

(57) ABSTRACT

A torsional resonator for suppressing unnecessary flexural vibration and providing excellent resonance characteristic is provided. A vibrator is a beam structure or a paddle-like projection structure added onto a beam structure and an electrostatic force produced due to the potential difference between an electrode and the vibrator adds a moment with the axis of the beam of the vibrator as the center axis, but does not add a force for producing flexure to the beam. As one method, the same AC signal and DC bias voltages different in polarity are applied to an electrode pair of the electrode brought away from the vibrator and the electrode brought close to the vibrator with torsional vibration of the vibrator, so that only torsional vibration can be excited.

8 Claims, 14 Drawing Sheets

OTHER PUBLICATIONS

Hashiguchi et al., "Fabrication of Silicon Quantum Wires Using Separation by Implanted Oxygen Wafer", Jpn. J. Appl. Phys., vol. 35, Part 2, No. 12A, Dec. 1, 1997, pp. 1649-1650.

Evoy et al., "Nanofabrication and Electrostatic Operation of Single-Crystal Silicon Paddle Oscillators", Journal of Applied Physics, vol. 86, No. 11, American Institute of Physics, Dec. 1, 1999, pp. 6072-6077.

Yasumura et al., "Quality Factors in Micron- and Submicron-Thick Cantilevers", Journal of Microelectromechanical Systems, vol. 9, No. 1, Mar. 2000, pp. 117-125.

Bannon, III et al., "High-Q HF Microelectromechanical Filters", IEEE Journal of Solid-State Circuits, vol. 35, No. 4, Apr. 2000, pp. 512-526.

* cited by examiner

FIG. 18 PRIOR ART
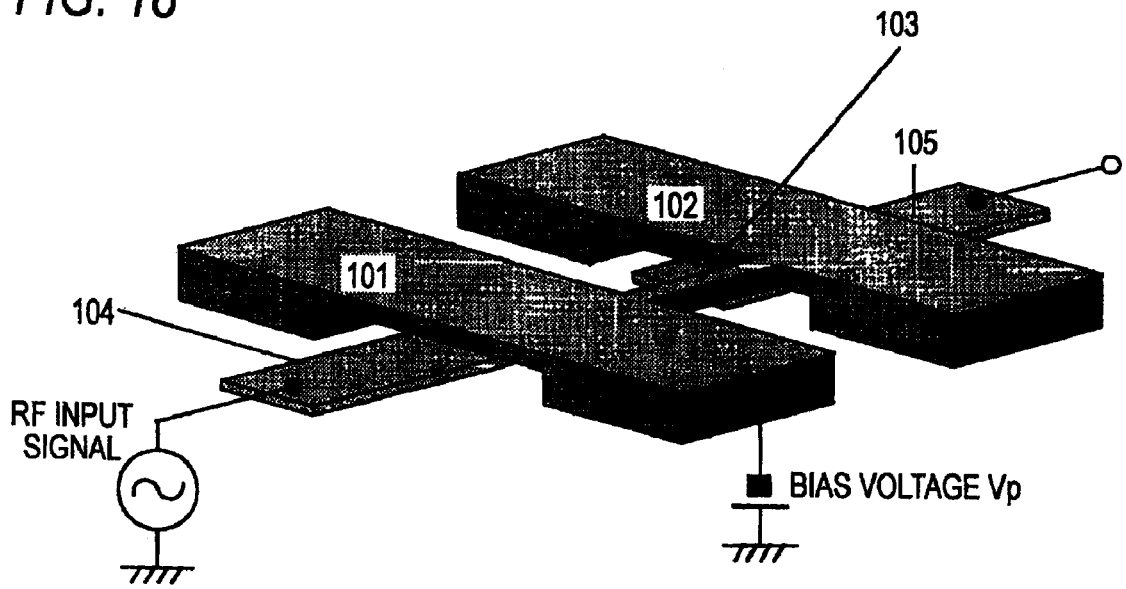
FIG. 19 PRIOR ART
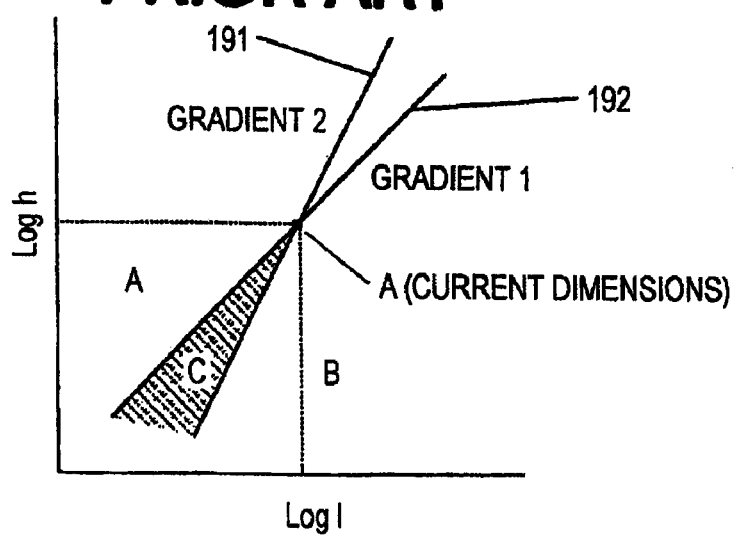

TORSIONAL RESONATOR AND FILTER USING THIS

TECHNICAL FIELD

This invention relates to a torsional resonator and a filter using the same and in particular to an art of realizing a high-performance filter circuit using torsional resonance in an electric circuit integrated at a high density.

BACKGROUND ART

A mechanical resonator in a related art will be discussed with reference to FIG. 18. FIG. 18 is a drawing to schematically show the configuration of a "mechanical vibration filter using flexural vibration" introduced in non-patent document 1.

The filter is formed by forming a pattern on a silicon substrate using a thin film process, and is made up of an input line 104, an output line 105, clamped-clamped beams 101 and 102 placed with a gap of 1 micron or less relative to the lines, and a coupling beams 103 for coupling the two beams. A signal input from the input line 104 is capacitively coupled with the beam 101, generating an electrostatic force on the beam 101. Only when the signal frequency matches a frequency close to the resonance frequency of an elastic structure made up of the beams 101 and 102 and the coupling beam 103, mechanical vibration is excited and is detected further as change in the electrostatic capacity between the output line 105 and the beam 102, whereby filtering output of the input signal is taken out.

For a clamped-clamped beam rectangular in cross section, letting elastic modulus be E, density be ρ, thickness be h, and length be L, resonance frequency f of flexural vibration becomes the following expression:

$$f = 1.03 \frac{h}{L^2} \sqrt{\frac{E}{\rho}}$$ [Expression 1]

Letting the material be polysilicon, E=160 GPa and ρ=2.2× $10^3$ kg/m$^3$ and letting dimensions be L=40 μm and h=1.5 μm, f=8.2 MHz, and a filter of about an 8-MHz band can be formed. As compared with a filter made up of passive circuits of a capacitor, a coil, etc., a steep frequency selection characteristic with a high Q value can be provided as mechanical resonance is used.

In the described configuration, however, to form a filter of a higher frequency band, the following restriction exists: It is obvious from (expression 1) that it is desirable that first the material should be changed for increasing E/ρ, but if E is increased, the beam displacement amount lessens if the beam deflecting force is the same, and it becomes difficult to detect beam displacement. Letting the index to represent the ease of bending a beam be the ratio between flexural amount d of the beam center part when static load is imposed on the beam surface of a clamped-clamped beam and beam length L, d/L, d/L is represented by the proportional relation of the following expression:

$$\frac{d}{L} \propto \frac{L^3}{h^3} \cdot \frac{1}{E}$$ [Expression 2]

Thus, to raise the resonance frequency while holding the value of d/L, at least E cannot be changed and a material with low density ρ needs to be found; a composite material of CFRP (Carbon Fiber Reinforced Plastics), etc., needs to be used as a material with low density and Young's modulus equal to polysilicon. In this case, it becomes difficult to form a minute mechanical vibration filter in a semiconductor process.

Then, as a second method not using such a composite material, the beam dimensions can be changed for increasing h·L$^{-2}$ in (expression 1). However, increasing the beam thickness h and lessening the beam length L lead to lessening the index of the ease of flexure, d/L in (expression 2), and it becomes difficult to detect beam flexure.

As for (expression 1) and (expression 2), the relation between log(L) and log(h) is shown in FIG. 19. A line 191 is relationship found from (expression 1) and a line 192 is relationship found from (expression 2). In FIG. 19, if L and h in the range (region A) above the line with gradient "2" with the current dimension A point as the origin are selected, f increases; if L and h in the range (region B) below the line with gradient "1" are selected, d/L increases. Therefore, the hatched portion in the figure (region C) is the range of L and h in which the resonance frequency can be raised while the beam flexural amount is also ensured.

It is evident from FIG. 19 that microminiaturization of the dimensions of both of the beam length L and the beam thickness h is a necessary condition for putting a mechanical vibration filter into a high frequency and that miniaturization of L and h on the same scaling, namely, lessening L and h while riding on the line with the gradient 1 is a sufficient condition for the hatched portion in FIG. 19.

Thus, in the mechanical resonator in the related art, the dimensions of the mechanical vibrator are miniaturized, whereby the resonance frequency is put into a high frequency. However, generally as the dimensions are miniaturized, the mechanical Q value of flexural vibration lowers; this is a problem. About this phenomenon, for example, non-patent document 2 shows the result of measuring the relationship among the beam length, the beam thickness, and the Q value of flexural resonance using a monocrystalline silicon cantilever. Non-patent document 2 shows that the Q value lowers as the beam length is shortened and the beam thickness is decreased. Therefore, if the resonator using flexural vibration in the related art is miniaturized and is applied to a filter, the Q value required for providing a desirable frequency selection characteristic may be unable to be obtained.

Then, a torsional resonator using a torsional vibrator as a resonator having an excellent Q value is considered. The torsional resonator excites vibrator by an electrostatic force between an input line 204 and a paddle 202 using vibrator 201 having the paddle 202 in the clamped-clamped beam center and converts change in the electrostatic capacity between an output line 205 and the paddle 202 into an electric signal, for example, as shown in FIG. 21. In the torsional resonator, the excited mode varies depending on the magnitude of each of voltage Vi between the paddle and the input line and voltage Vo between the paddle 202 and the output line 205 and the phase difference. Now, assuming that |Vi|>|Vo| and that participation of the electrostatic force of Vo in beam vibration is extremely small, flexural vibration and torsional vibration are excited in the vibrator.

Thus, in addition to torsional vibration, flexural vibration is also excited in the electrode for exciting torsional vibration in the torsional resonator using the torsional vibrator and if such a torsional resonator is applied to a filter, the filter is provided with an unintentional passage band in addition to a passage band.

Differential—signaling described in patent document 1 is available as a method of selectively exciting a specific vibration mode. This is an excitation method for higher-order flexural vibration having a plurality of antinodes; one of an AC signal v and a −v signal different in phase 180 degrees from the AC signal v is applied to the electrode brought close to the antinode and the other is applied to the electrode brought away from the antinode. To produce the AC signal −v from the AC signal v, it is a common practice to divide v and pass through a 180-degree phase shifter.

Non-patent document 1: Frank D. Bannon III, John R. Clark, and Clark T.-C. Nguyen, "High-QHF Microelectromechanical Filters," IEEE Journal of Solid-State Circuits, Vol. 35, No. 4, pp. 512-526, April 2000.

Non-patent document 2: K. Y. Yasumura et al., "Quality Factors in Micron- and Submicron-Thick Cantilevers," IEEE Journal of Microelectromechanical Systems, Vol. 9, No. 1, March 2000.

Patent document 1: JP-A-2002-535865 (p 20-p 21, FIG. 8)

DISCLOSURE OF THE INVENTION

Problems to be Solved by the Invention

However, in the method in patent document 1, usually the phase shifter requires a line length of wavelength order and thus miniaturization of a filter is hindered. Adjustment to produce 180-degree phase with accuracy becomes necessary. Further, a shift from the objective phase shift amount occurs at other than the objective frequency point and thus if an attempt is made to use the AC signal to excite a resonator whose resonance frequency is adaptively variable, the resonator can be excited with v and −v at one frequency, but if the resonance frequency is changed to a different resonance frequency, it becomes difficult to ensure the −v signal.

It is therefore an object of the invention to provide a torsional resonator that can suppress any vibration mode other than torsional vibration of the torsional resonator as much as possible according to a simple method and can be used at a high frequency.

Particularly, it is also an object of the invention to provide a resonator that can suppress any vibration mode other than torsional vibration as much as possible according to a simple method even for a resonator whose resonance frequency can be adaptively switched.

Means for Solving the Problems

To solve the above-described problems, a torsional resonator of the invention is characterized by the fact that a vibrator is a beam structure or a paddle-like projection structure added onto a beam structure and that an electrostatic force produced due to the potential difference between an electrode and the vibrator adds a moment with the axis of the beam of the vibrator as the center axis and does not add a force for producing flexure to the beam.

According to the configuration, it is made possible to suppress any vibration mode other than torsional vibration of the torsional resonator as much as possible according to a simple method.

That is, the torsional resonator of the invention is characterized by the fact that it is a torsional resonator comprising a vibrator for executing mechanical vibration and electrodes positioned close to the vibrator and having an electromechanical conversion function of converting voltage change between the vibrator and the electrodes into vibration of the vibrator, wherein the vibrator comprises a beam structure, the torsional resonator comprising drive means which is configured so that an electrostatic force produced due to the potential difference between the electrode and the vibrator produces a moment with the axis of the beam structure as the center axis, and is configured so as to apply the same AC signal and DC bias voltages different in polarity to an electrode pair of the electrode brought away from the vibrator and the electrode brought close to the vibrator with torsional vibration of the vibrator.

According to the described configuration, torsional vibration can be produced according to the simple configuration and the resonance characteristic having a desirable Q value can be obtained. According to the configuration, only torsional vibration can be produced according to the simple configuration.

The torsional resonator of the invention includes a torsional resonator wherein the beam structure includes a beam including projections at the axially symmetric positions.

According to the configuration, an electrostatic force is easily produced between the electrode and the beam structure and vibration can be produced efficiently. Preferably, the beam is a clamped-clamped beam, which is more stable, but the beam may be a cantilever.

The torsional resonator of the invention includes a torsional resonator wherein the beam structure includes a paddle-like projection.

The torsional resonator of the invention includes a torsional resonator comprising two or more electrode pairs, wherein the drive means switches the polarity of the DC bias voltage applied to at least some electrodes of the electrode pairs, thereby switching torsional resonance between a low-order mode and a high-order mode.

The torsional resonator of the invention is characterized by the fact that the electrodes are placed in the torsion direction relative to the vibrator so as to become equal in distance from the vibrator with torsional vibration of the vibrator to form electrode pairs, and that the drive means is configured so as to apply the same AC signal and the same DC bias voltage to the electrode pair with torsional vibration of the vibrator.

According to the configuration, the same voltage may be applied to the electrodes, so that the drive means can be simplified.

The torsional resonator of the invention includes a torsional resonator including a plurality of the torsional resonators having different torsional resonance frequencies and a switch element for selecting at least one of the torsional resonators.

The torsional resonator of the invention includes a torsional resonator including a plurality of torsional resonators placed electrically in parallel.

The torsional resonator of the invention includes a torsional resonator wherein the torsional resonator is housed in a case in which an atmosphere is sealed in a vacuum.

A filter of the invention includes a filter using the torsional resonator described above.

Advantages of the Invention

According to the configuration of the torsional resonator of the invention, a filter that has a high Q value and can be used in a band of several hundred MHz to several GHz can be provided.

BRIEF DESCRIPTION OF THE DRAWINGS

[FIG. 18] A schematic drawing to show a filter using a mechanical resonator in a related art.

[FIG. 19] A characteristic drawing to show the relationship between the dimensions of mechanical resonator and conversion to high frequency in a related art example.

DESCRIPTION OF REFERENCE NUMERALS

Figure 1:
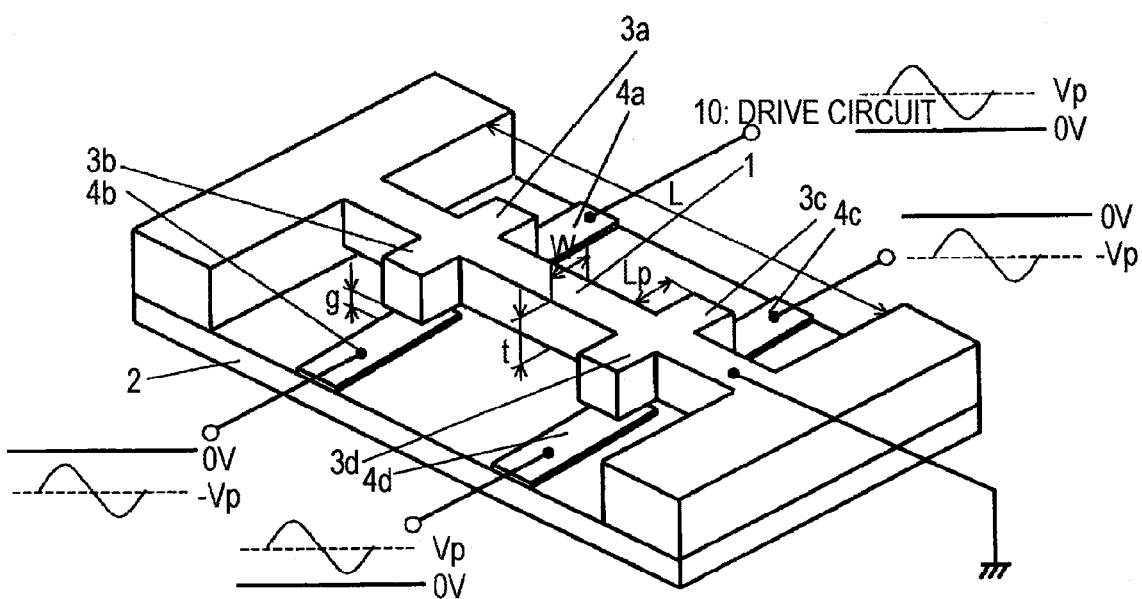
[FIG. 1] A perspective view of a torsional resonator in a first embodiment of the invention.

1 Vibrator
2 Substrate
3 Paddle
4 Electrode
11 Power splitter
12a, 12b Capacitor
13a, 13b Inductance
14 Torsional resonator
15 Current-voltage conversion circuit
31 Silicon oxide layer
32 Monocrystalline silicon layer
R Resist
101, 102 Clamped-clamped beam type vibrator
103 Coupling beam
104 Input line
105 Output line
191 Line indicating relationship between length L and thickness h having same frequency
192 Line indicating relationship between length L and thickness h having same index of ease of flexure
201 Vibrator
202 Paddle
204 Input line
205 Output line

BEST MODE FOR CARRYING OUT THE INVENTION

Referring now to the accompanying drawings, there are shown preferred embodiments of the invention in detail.

First Embodiment

FIG. 1 is a perspective view of a torsional resonator in a first embodiment of the invention. The torsional resonator of the first embodiment is an electromechanical resonator having a vibrator 1 having paddle-like projections 3a, 3b, 3c, and 3d at axially symmetric positions for executing mechanical vibration and electrodes 4a, 4b, 4c, and 4d placed close to the paddle-like projections 3a, 3b, 3c, and 3d and having an electromechanical conversion function of converting voltage change between the paddle-like projections 3a, 3b, 3c, and 3d and the electrodes 4a, 4b, 4c, and 4d corresponding thereto into vibration of the vibrator, characterized by drive means configured so that an electrostatic force produced due to the potential difference between the electrode 4a, 4b, 4c, 4d and the vibrator produces a moment with the axis of a beam structure of the vibrator 1 as the center axis.

The vibrator 1 is a clamped-clamped beam fixed at both ends. The vibrator 1 is provided with the four paddles 3a to 3d. The electrodes 4a to 4d are placed on a substrate 2 with a gap g facing the paddles 3. The material of the beam is monocrystalline silicon with Young's modulus of about 160 GPa, and length L is 1.0 μm, thickness t is 100 nm, width W is 100 nm, and paddle length Lp is 100 nm.

Figure 2:
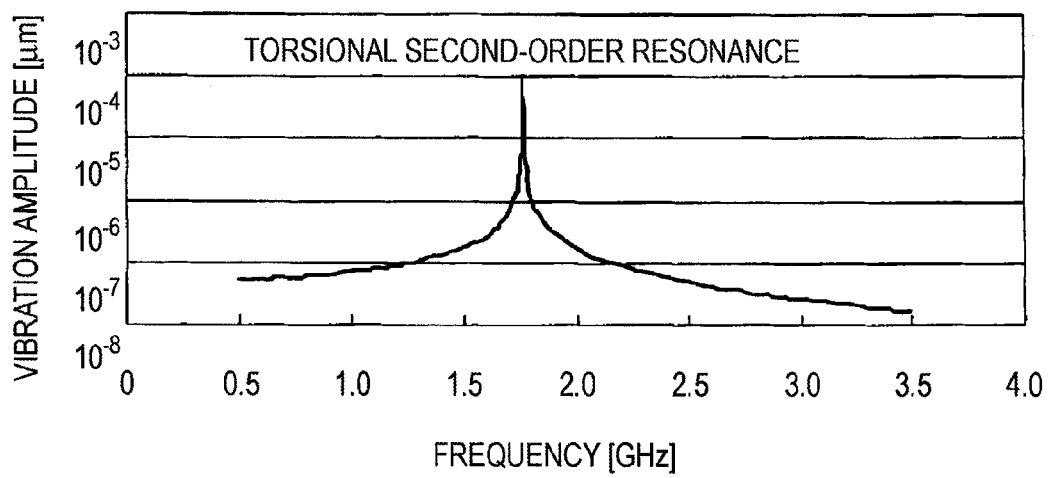
[FIG. 2] Amplitude spectrum of the torsional resonator in the first embodiment of the invention.
Figure 3:
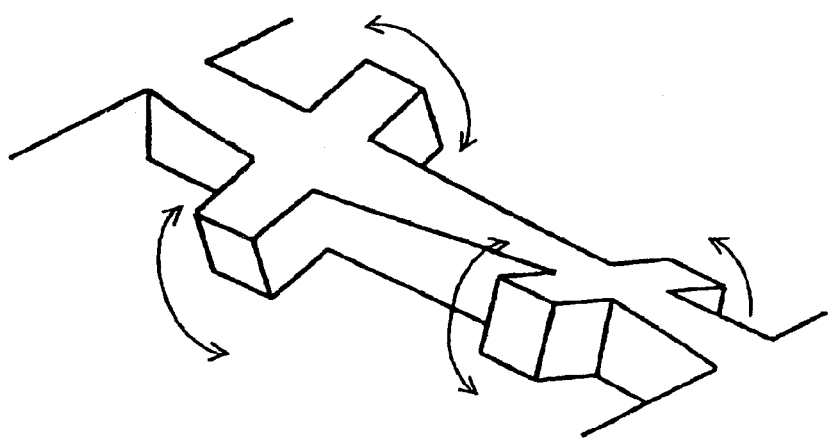
[FIG. 3] A drawing to show a torsional second-order resonance waveform in the first embodiment of the invention.

The vibrator 1 is grounded electrically and drive means 10 controls energization of the electrodes 4a to 4d as follows: A bias voltage Vp is applied to the electrodes 4a and 4d, a bias voltage −Vp is applied to the electrodes 4b and 4c, and an AC signal is applied to the electrodes 4a to 4d. At the potential peak of AC voltage, the maximum electrostatic force is applied to the paddles 3a and 3d toward the substrate direction. At this time, the minimum electrostatic force is applied to the paddles 3b and 3c toward the substrate direction. This is equivalent to the fact that the force toward the substrate direction acts on the paddles 3a and 3d and the force toward above the substrate 2 acts on the paddles 3b and 3c when viewed from the operation point (when the potential of the AC voltage is 0). Consequently, the vibrator 1 receives an axial moment and torsional vibration is excited. FIG. 2 shows the result indicating the displacement amount of the paddle tip when the vibrator 1 is excited in the state in FIG. 1 on the frequency axis. A resonator having the spectrum peak in 1.8-GHz torsional second-order resonance having a resonance waveform as shown in FIG. 3 is implemented. Here, the resonance waveform means "twisted form of vibrator axis" and as the axis is twisted, the paddle displaces, but the paddle does not become deformed.

Figure 4:
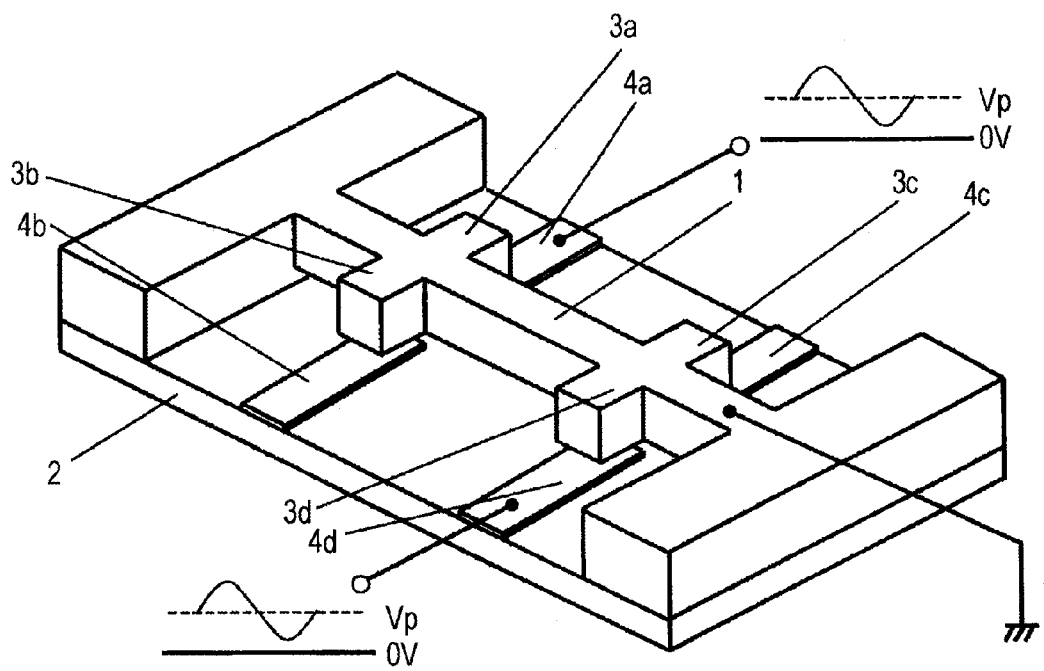
[FIG. 4] A perspective view of a torsional resonator wherein flexural vibration is also excited.
Figure 5:
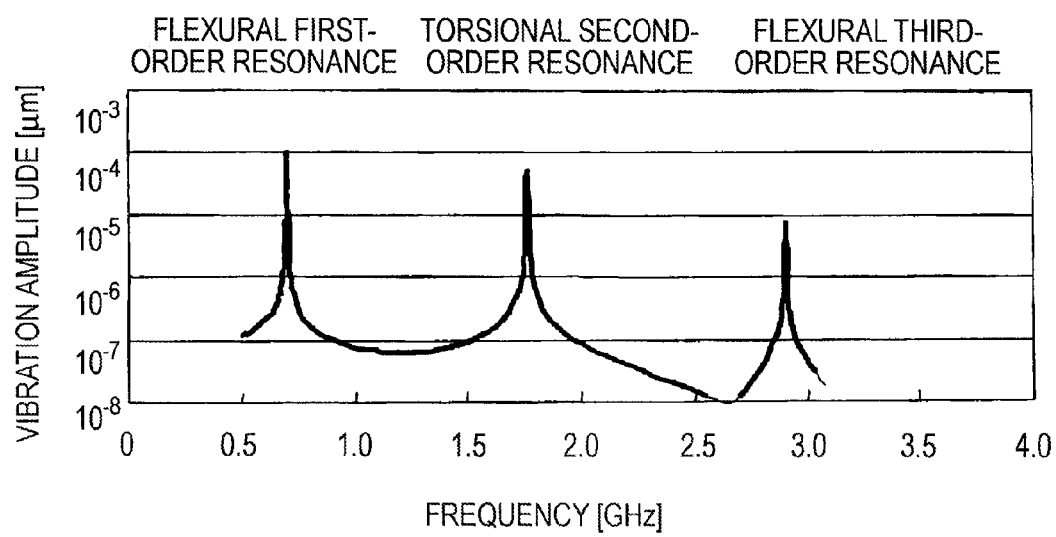
[FIG. 5] Amplitude spectrum of the torsional resonator in the configuration in FIG. 4.

The displacement amount spectrum when the bias voltage Vp and AC signal are applied only to the electrodes 4a and 4d on the diagonal line as shown in FIG. 4 becomes as in FIG. 5. In addition to 1.8-GHz torsional second-order resonance, 0.70-GHz flexural first-order resonance (substrate vertical direction) and 2.9-GHz flexural third-order resonance (substrate vertical direction) are also excited and if the torsional resonator is applied to a filter circuit, the filter circuit also has a passage area in any other frequency band than the objective frequency band; this is not desired.

Figure 6:
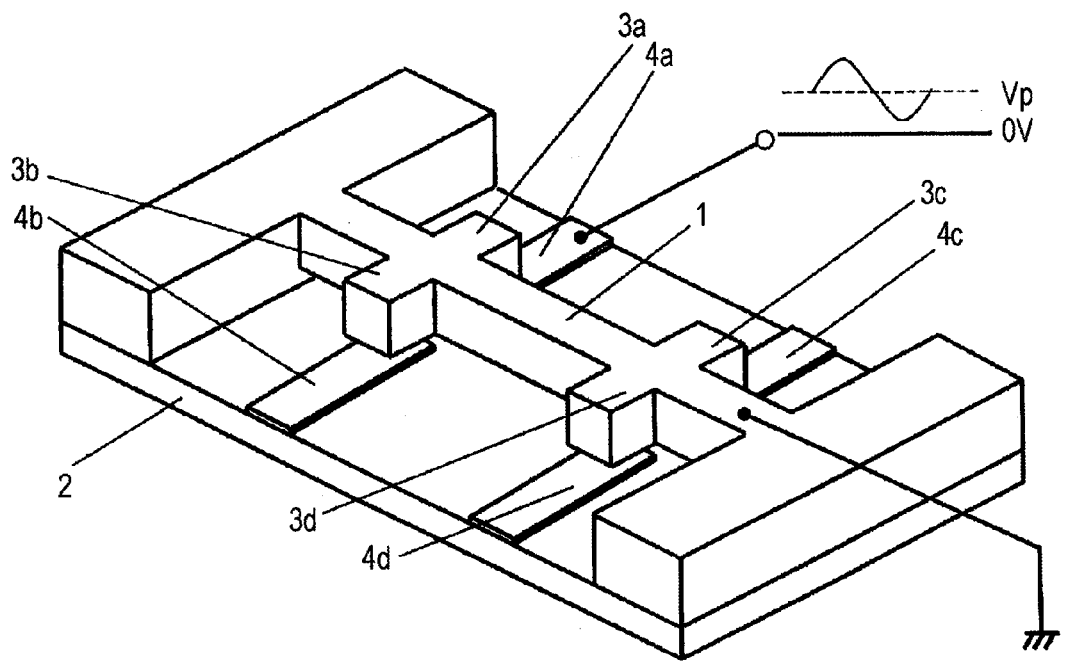
[FIG. 6] A perspective view of a torsional resonator wherein flexural vibration is also excited.
Figure 7:
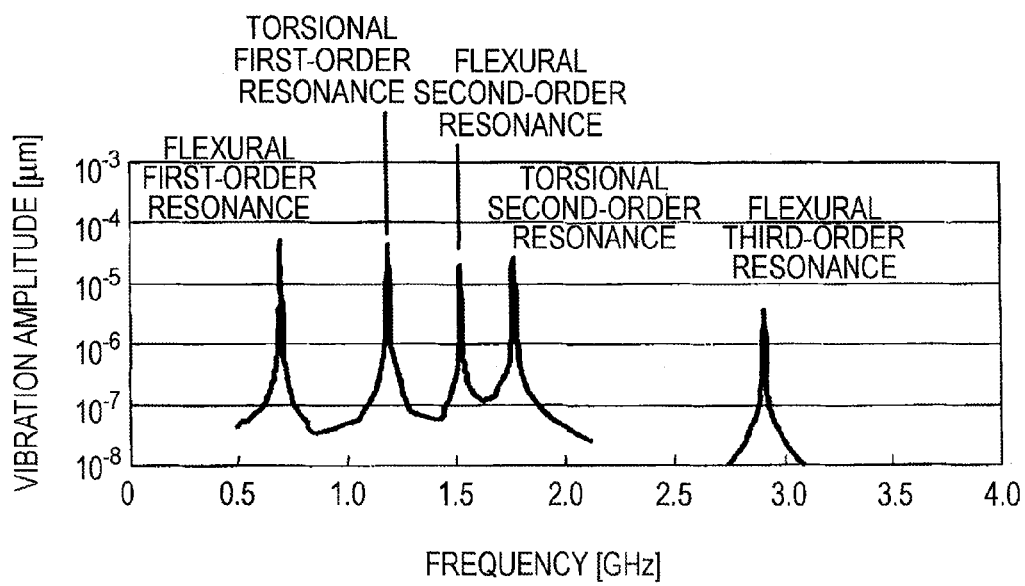
[FIG. 7] Amplitude spectrum of the torsional resonator in the configuration in FIG. 6.

Further, the displacement amount spectrum when the bias voltage Vp and AC signal are applied only to one electrode 4a as shown in FIG. 6 becomes as in FIG. 7 and further 1.2-GHz torsional resonance first-order and 1.5-GHz flexural second-order resonance (substrate vertical direction) are also excited.

As is obvious from the comparison between FIG. 2 and FIG. 5 and FIG. 7, excitation is conducted in such a manner that power is supplied to the electrodes 4a to 4d corresponding to the paddles 3a to 3d and the electrostatic forces are applied to the paddles as mutually torsional direction forces according to the configuration in FIG. 1, whereby the best filter characteristic can be provided.

Figure 8:
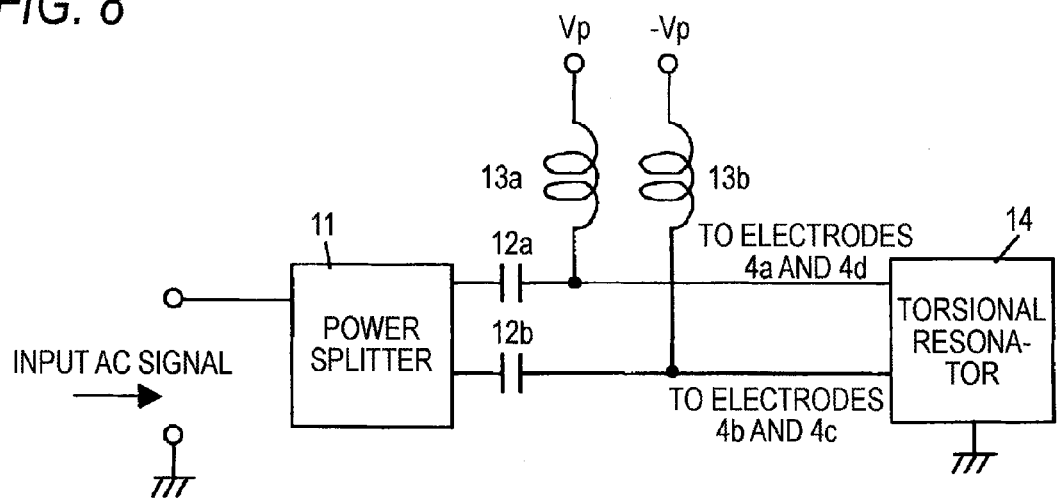
[FIG. 8] A block diagram of a torsional resonator excitation circuit in the first embodiment of the invention.

Drive circuit implementing the drive means 10 used for excitation in FIG. 1 can be provided, as shown in FIG. 8 for example, by a power splitter 11 for distributing AC signal and cutting DC of output of the power splitter 11 through capacitors 12a and 12b and then supplying one pulled up with the bias voltage Vp and the other pulled up with the bias voltage −Vp through inductances 13a and 13b to the electrodes 4a and 4d and the electrodes 4b and 4c of the torsional resonator in FIG. 1.

A general phase shifter for electrically changing a phase requires the line length of wavelength order and it is hard to miniaturize the excitation circuit of the resonator and precise 180-degree phase shift adjustment becomes necessary. The same AC signal is pulled up with the bias voltages different in polarity and inductors as in the embodiment, whereby beam excitation force different in phase precisely 180 degrees can be obtained.

In the torsional resonator in FIG. 1, the electric impedance becomes the minimum in the vicinity of the resonance point of the vibrator 1 and the largest current flows into the torsional resonator. For example, as shown in FIG. 9, the terminal pulled up with the bias voltage Vp, for example, the electrode 4d is provided with a current-voltage conversion circuit 15 and output of the current-voltage conversion circuit 15 is used as an output terminal, whereby a filter including input/output voltage terminal can be formed.

Figure 9:
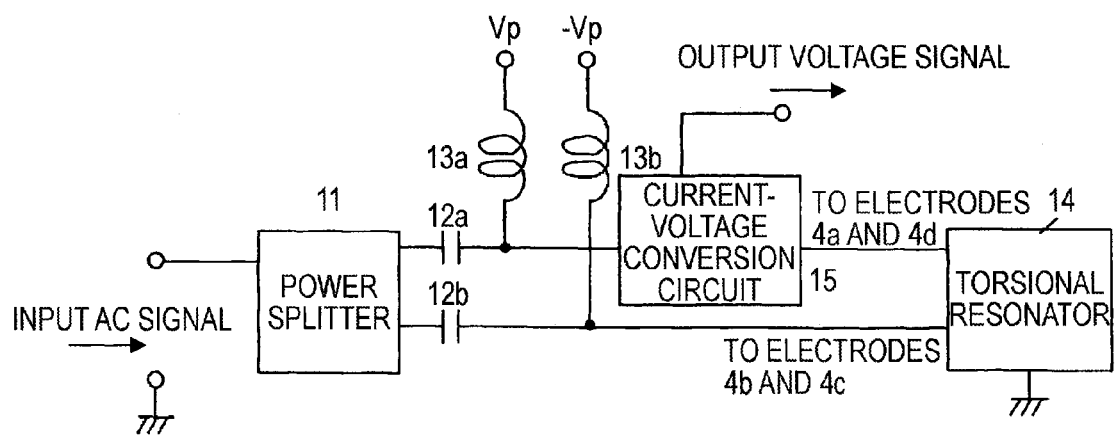
[FIG. 9] A block diagram to show a torsional resonator excitation circuit provided with an output voltage signal terminal in the first embodiment of the invention.
Figure 10:
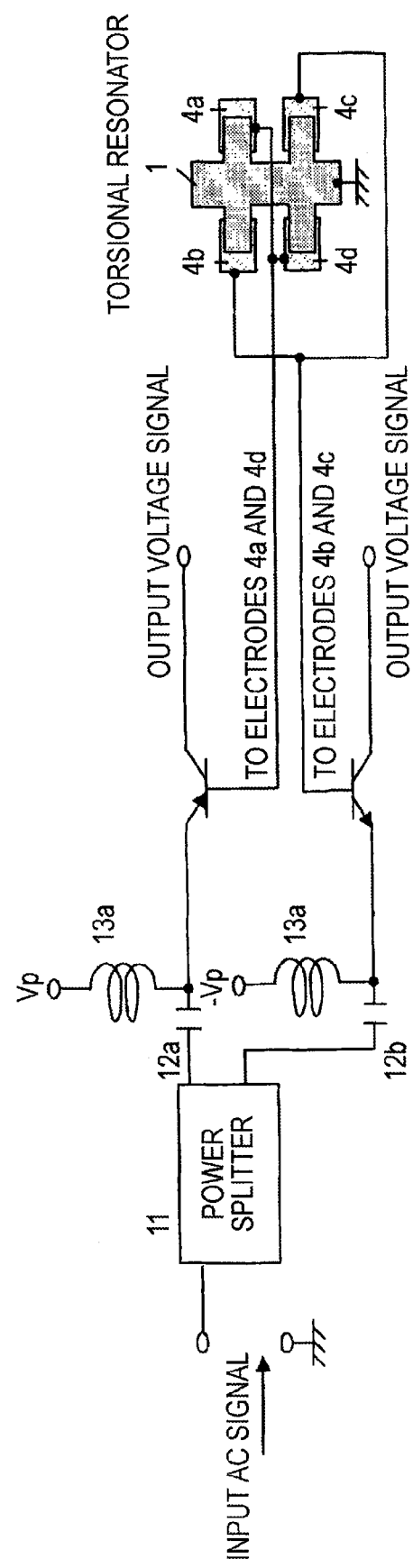
[FIG. 10] A device schematic representation of a torsional resonator excitation circuit provided with an output voltage signal terminal in the first embodiment of the invention.

The current-voltage conversion circuit of the filter shown in FIG. 9 can be implemented as a transistor circuit as in FIG. 10. Here, a complementary transistor pair is provided on two AC signal lines to which the bias voltages Vp and −Vp different in polarity are applied and a common-base amplifier is formed. A torsional resonator is inserted between the base and ground. Filter outputs of two channels different in phase are obtained from collectors of the transistors.

Figure 11A:
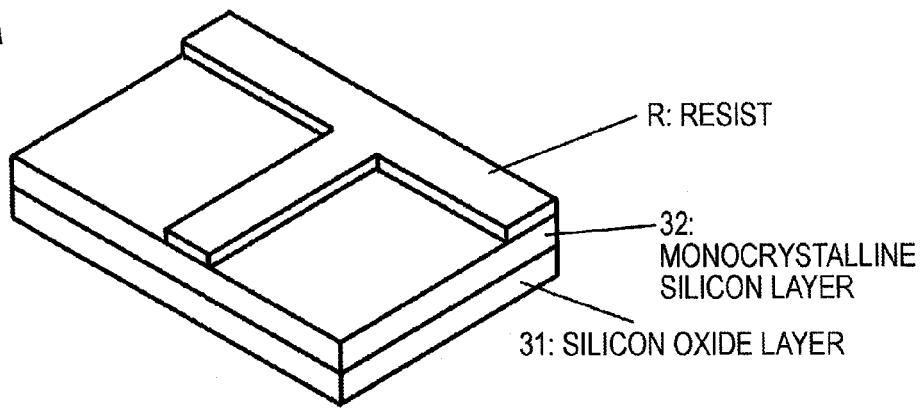
[FIG. 11] A schematic representation of a manufacturing method of the torsional resonator in the first embodiment of the invention.
Figure 11B:
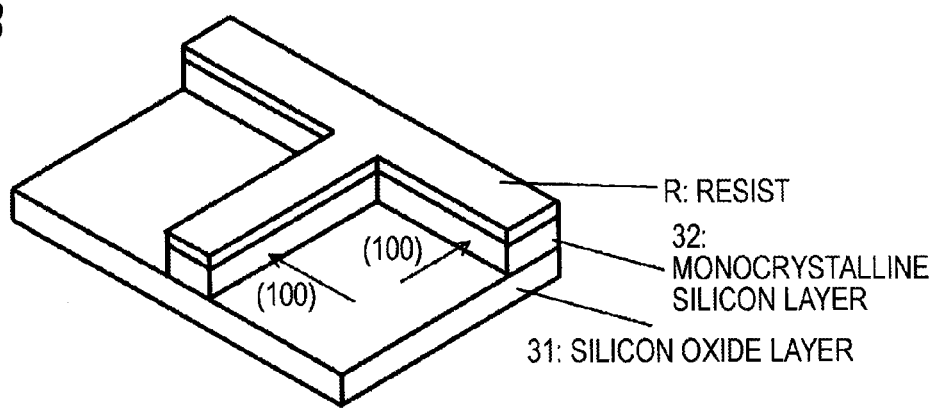
Figure 11C:
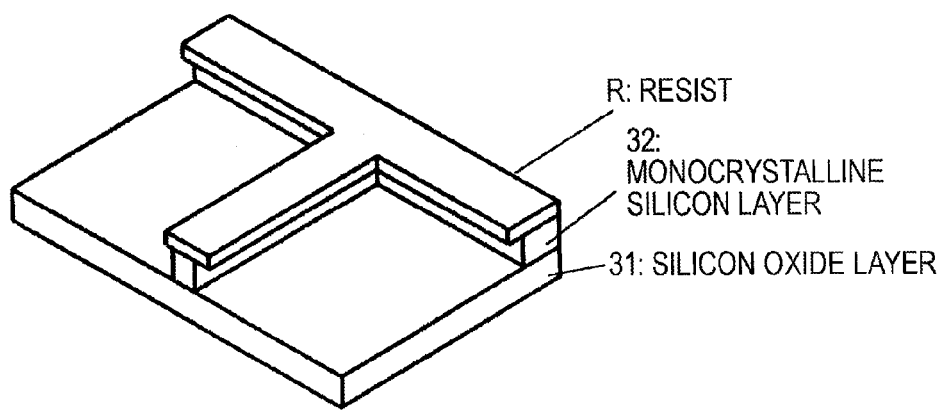

Next, a manufacturing method of the torsional resonator in the first embodiment of the invention will be discussed. FIGS. 11(a) to 11(c) show a part of the beam on an enlarged scale and show a manufacturing process thereof.

In this process, an SOI (Silicon on Insulator) substrate is used. In this case, a monocrystalline silicon layer of the upper part of the SOI substrate becomes a beam structure.

In the figure, a silicon substrate as a base layer is not shown; SOI (Silicon-on-Insulator) substrate with a monocrystalline silicon layer 32 in any desired carrier density as a device forming layer put on the silicon substrate surface through an oxide film 31 made of a silicon oxide film is used.

First, a resist is applied onto the monocrystalline silicon layer 32 for patterning (FIG. 11(a)). With the resist as a mask, silicon is worked in the vertical direction using RIE (reactive ion etching) (FIG. 11(b)). (100) planes are exposed to walls of the monocrystalline silicon layer 32. Next, anisotropic etching of the monocrystalline silicon layer 32 is performed with KOH and a silicon structure narrower than the mask pattern width is formed (FIG. 11(c)).

According to the configuration, a torsional resonator with a high Q value as compared with a resonator containing flexural vibration can be provided.

Figure 20:
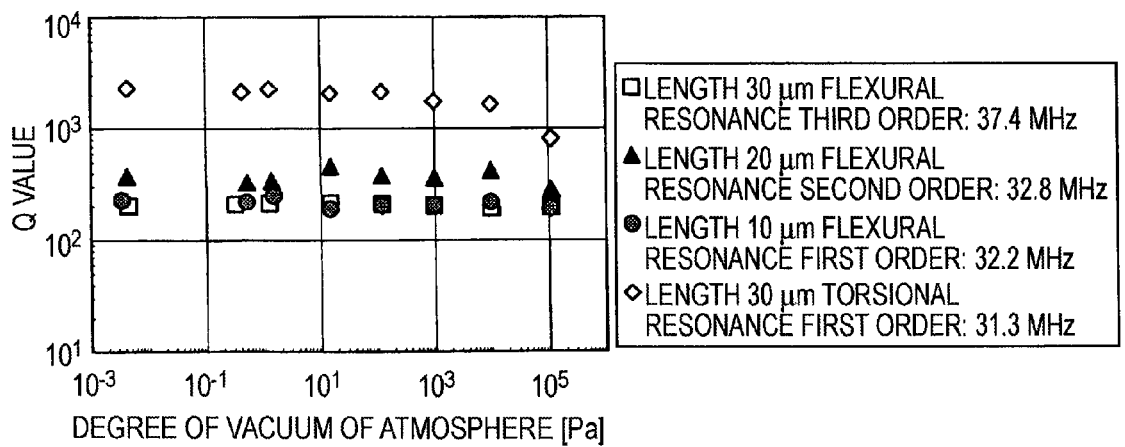
[FIG. 20] A drawing to show the experimental result of making a comparison between flexural vibration and the Q value of torsional vibration.
Figure 21:
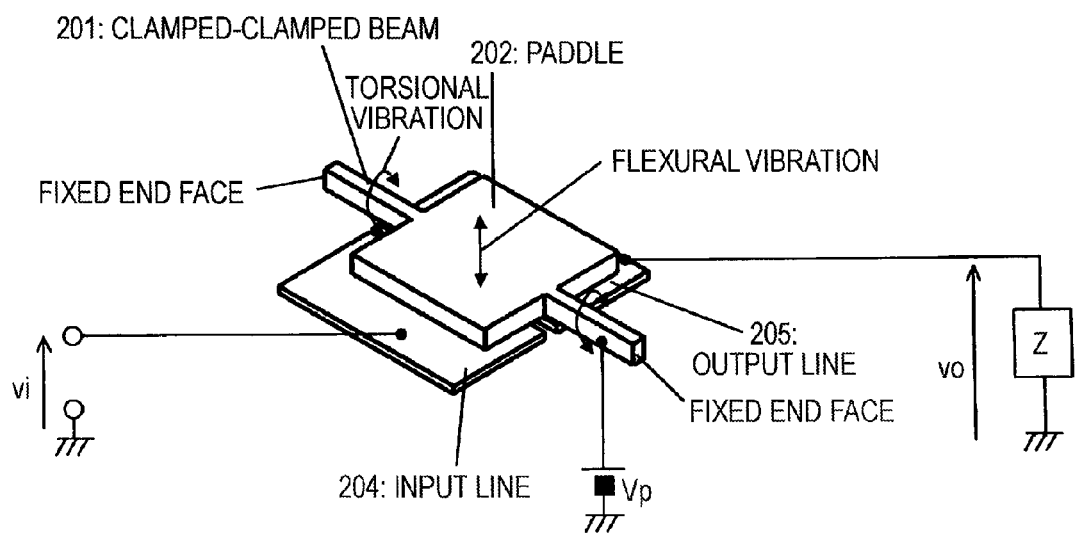
[FIG. 21] A drawing to show a resonator wherein both flexural vibration and torsional vibration are excited.

To prove the Q value difference between flexural vibration and torsional vibration, the inventor et al. excited a clamped-clamped beam formed using aluminum sputter thin film about 2 μm in thickness and about 10, 20, 30 μm in length and measured the Q values. In FIG. 20, the horizontal axis indicates the degree of vacuum and the vertical axis indicates the Q value. The Q values of flexural resonance third order about 30 μm in length, flexural resonance second order about 20 μm in length, and flexural resonance first order about 10 μm in length are 200 to 400; while, the Q value of torsional resonance first order 20 μm in length is 2000 and the torsional vibration has superiority in the Q value over the flexural vibration.

Thus, to miniaturize the resonator and put resonance into high frequency, it is considered that a resonator using torsional vibration can be used to form a resonator with a high Q value as compared with flexural vibration.

In non-patent document 3, a clamped-clamped beam is excited by an electrostatic force and flexural resonance and torsional resonance of the same resonator are observed. According to non-patent document 3, flexural resonance spectrum and torsional resonance spectrum are shown and nonlinearity is observed from the flexural resonance spectrum. It is noticeable depending on the magnitude of the electrostatic force exciting the beam and is an undesired characteristic for use of the resonator for a filter circuit. However, nonlinearity is not observed from the torsional resonance spectrum and it is seen that a good characteristic can be provided by using the torsional resonator for a filter circuit.

Non-patent document 3: S. Evoy et al., "Nanofabrication and electrostatic operation of single-crystal silicon paddle oscillators," Journal of Applied Physics, Vol. 86, No. 11, 1 Dec. 1999, pp. 6072-6077.

Next, a quantum wire generation method introduced in non-patent document 4 can also be used as another method using anisotropic etching of silicon. FIG. 12 is a basic process drawing.

Figure 12A:
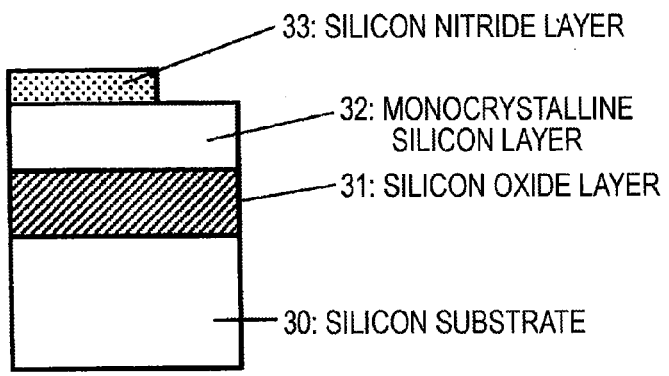
[FIG. 12] A schematic representation to show a modified example of the torsional resonator in the first embodiment of the invention.

First, a silicon nitride film 33 is formed on an SOI substrate on which a silicon layer 32 is put through a silicon oxide layer 31 with a monocrystalline silicon substrate 30 as a base layer and is patterned (FIG. 12(a)). It is formed so that the edge of the pattern is along (110) of the silicon layer 32.

Figure 12B:
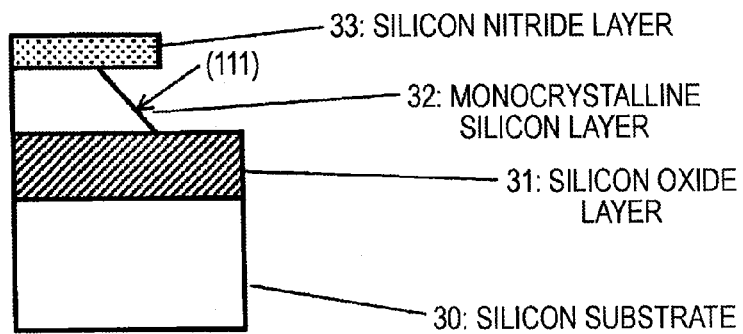

Next, anisotropic etching of the silicon layer 32 is performed using KOH. Since the etching speed of (111) plane is extremely low as compared with that of any other plane, as a result, the etching proceeds so that the (111) plane exposes as shown in FIG. 12(b).

Oxidation is executed with the top face covered with the silicon nitride film 33, the (111) plane is locally protected by a silicon oxide film 35, and the silicon nitride film 33 as the mask is again patterned.

Figure 12C:
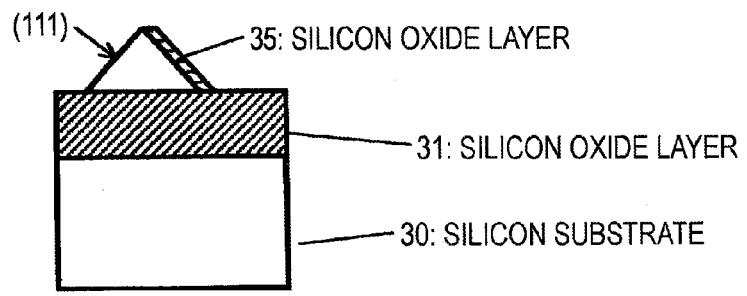

Again, anisotropic etching of the silicon layer 32 is performed using KOH, whereby a silicon beam structure triangular in cross section can be provided as shown in FIG. 12(c). The structure becomes a moving body as a local SiO$_2$ protective film and the silicon oxide layer 31 of an intermediate layer of the SOI substrate are removed with hydrofluoric acid.

Figure 12D:
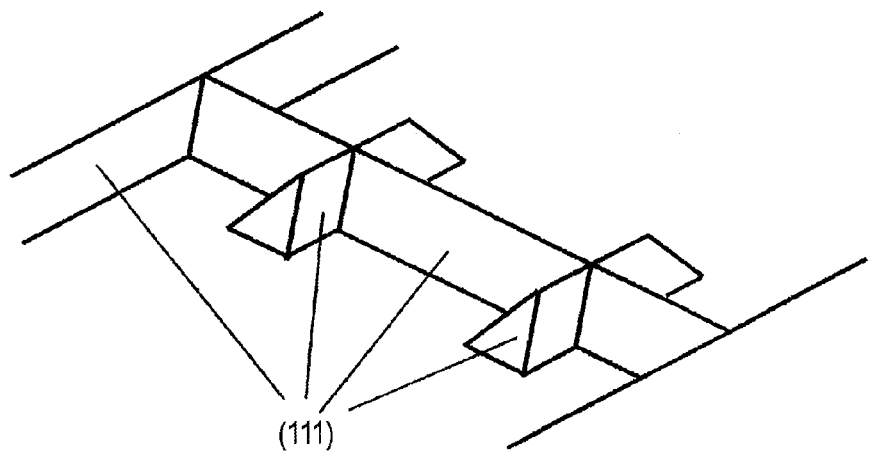

Finally, a vibrator of the torsional resonator is subjected to shape working so as to form a vibrator of an axially symmetric structure as shown in FIG. 12(d).

Non-patent document 4: G. Hashiguchi and H. Mimura, "Fabrication of Silicon Quantum Wires Using Separation by Implanted Oxygen Wafer," Jpn. J. Appl. Phys. Vol. 33 (1994), pp. L1649-1650.

The processes in FIGS. 11 and 12 can form a fine structure exceeding the limit of the patterning width in a semiconductor processing and therefore are useful processes for manufacturing a minute resonator of several hundred MHz to several GHz.

Second Embodiment

Next, a second embodiment of the invention will be discussed.

Figure 13:
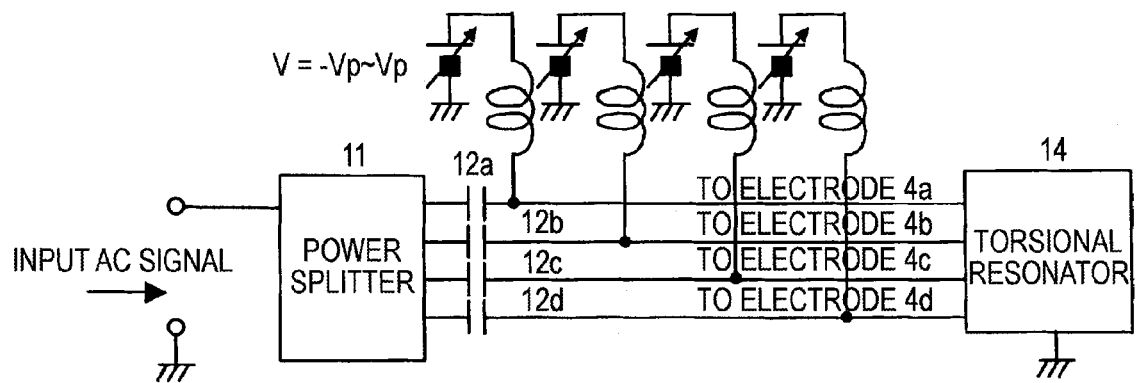
[FIG. 13] A block diagram of a torsional resonator excitation circuit in a second embodiment of the invention.
Figure 14:
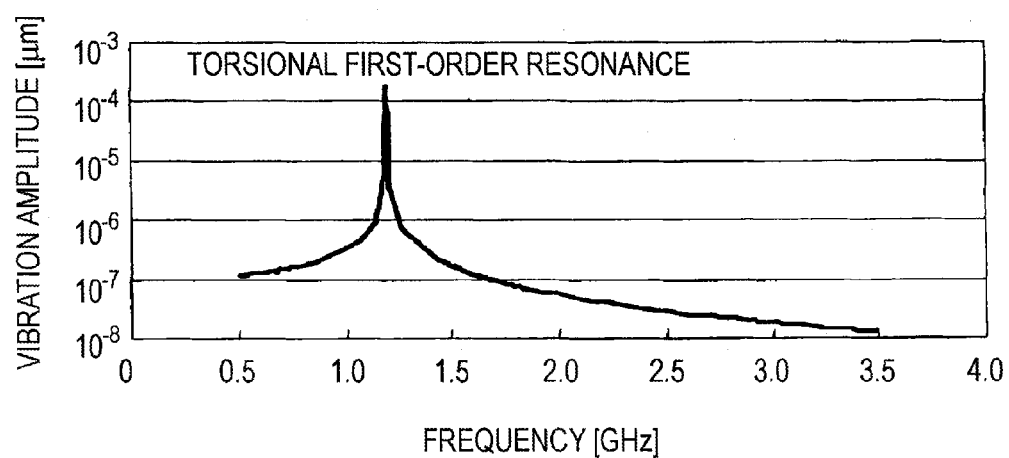
[FIG. 14] An amplitude spectrum drawing of a vibrator when only torsional first-order vibration is excited in the second embodiment of the invention.

FIG. 13 is a block diagram of a circuit for exciting a torsional resonator in a second embodiment of the invention. Placement of a vibrator and electrodes is similar to that in FIG. 1 shown in the first embodiment, but an input signal is divided into four signals by a power splitter 11 and the bias voltages applied to electrodes 4a to 4d can be set in the range of −Vp to Vp. The amplitude spectrum of the vibrator when the bias voltage Vp is applied to the electrodes 4a and 4d and the bias voltage −Vp is applied to the electrodes 4b and 4c has only torsional second-order resonance as shown in FIG. 2. However, the bias voltage to the electrodes 4a and 4c is switched to Vp and the bias voltage to the electrodes 4b and 4d is switched to −Vp, whereby the amplitude spectrum of the vibrator 1 can be changed to that having only torsional first-order resonance as shown in FIG. 14. That is, as the bias voltages are switched, a torsional resonator having a different torsional resonance frequency can be formed.

Figure 15A:
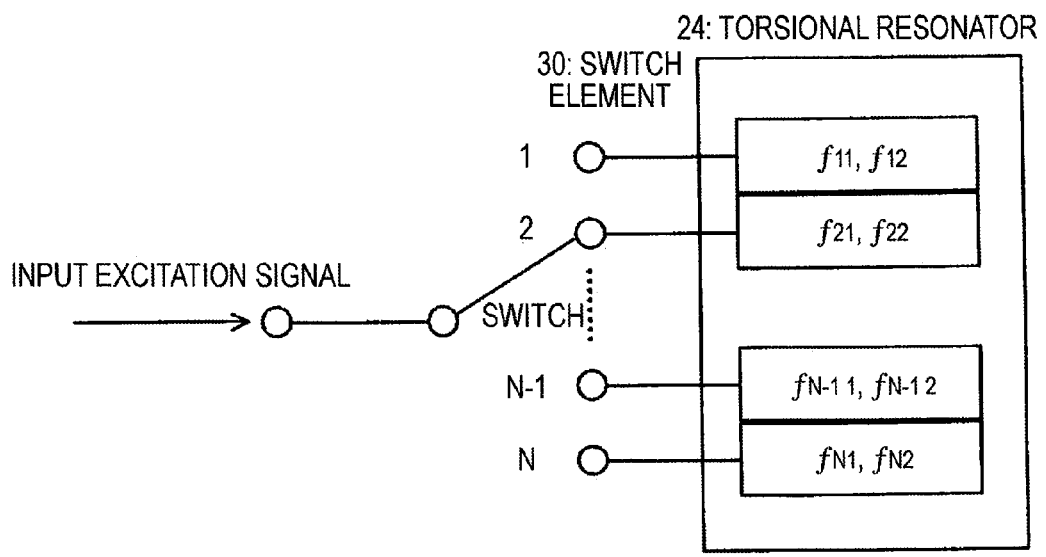
[FIG. 15] A drawing to show a configuration wherein N torsional resonators are placed in parallel in the second embodiment of the invention and an amplitude spectrum drawing.
Figure 15B:
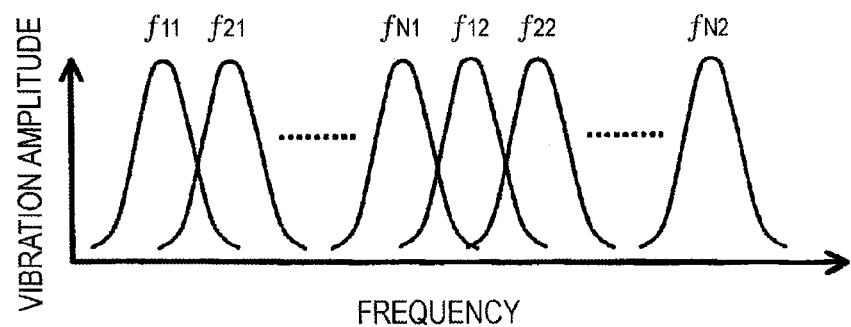

FIG. 15(a) shows a configuration wherein N torsional resonators of the second embodiment having different resonance frequencies are arranged in parallel and one of them is selected by a switch element 30. Torsional resonators 24 having 2×N different resonance frequencies can be configured by switching the bias voltage and making switch selection. Assuming that the torsional resonance frequency of the ith resonator can be switched between $f_{i1}$ and $f_{i2}$, 2N spectra can be arranged at equal intervals on the frequency axis as in FIG. 15(b) and it is made possible to use as a frequency selection type filter.

In a general phase shifter for electrically changing a phase, the phase shift amount at one specific frequency point can be set, but the phase shift amount varies in other bands. However, the same AC signal is pulled up with the bias voltages different in polarity and inductors as in the embodiment, whereby although the resonance excitation mode is switched adaptively between the higher order and the lower order, if it can be assumed that the inductor is sufficiently high impedance in switchable frequency band, beam excitation force different in phase precisely 180 degrees can be obtained.

According to the configuration, the electrostatic force produced due to the potential difference between the electrode and the vibrator adds a moment with the axis of the beam of the vibrator as the center axis and does not add a force for producing flexural vibration to the beam, so that it is made possible to suppress any vibration mode other than torsional vibration of the torsional resonator as much as possible according to the simple method, and a filter that has a high Q value and can be used in a band of several hundred MHz to several GHz using the torsional resonator can be provided.

In the first and second embodiments of the invention, two channels of the positive voltage Vp and the negative voltage −Vp are used as the bias voltage, but two channels of 0 V and Vp may be used. At this time, a bias voltage of Vp/2 may be added to the vibrator 1 in FIG. 1.

Third Embodiment

Next, a third embodiment of the invention will be discussed.

Figure 16A:
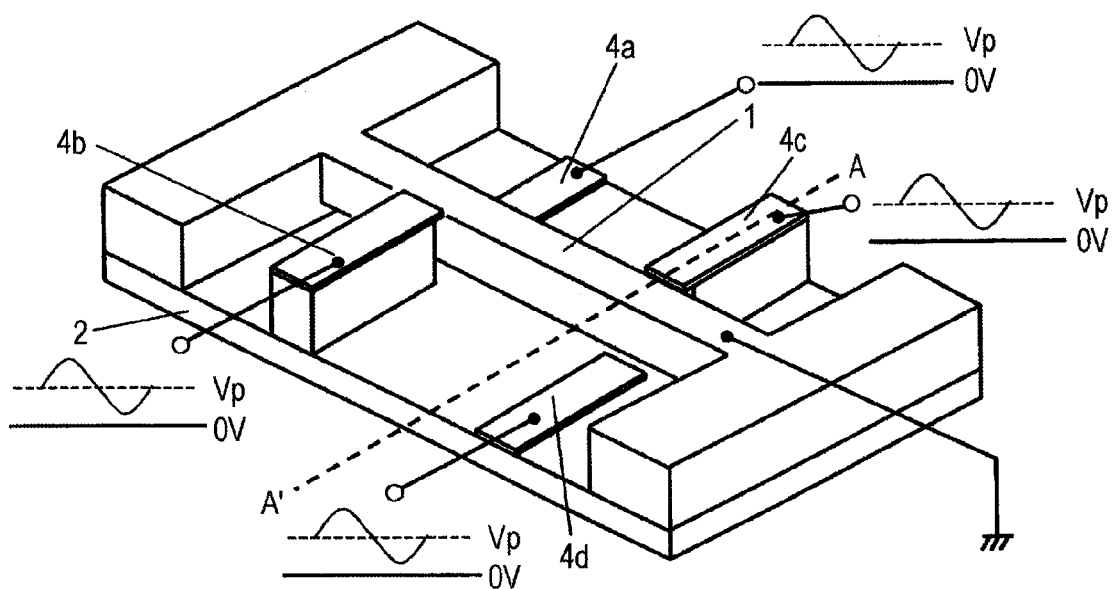
[FIG. 16] A drawing to show a torsional resonator of a third embodiment of the invention; (a) is a perspective view and (b) is a sectional view taken on line A-A in (a).
Figure 16B:
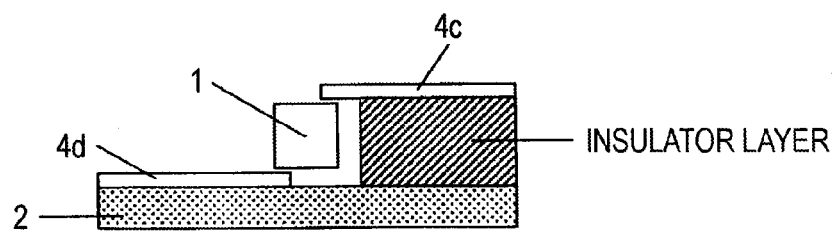

In the first and second embodiments described above, adjustment is made using the power splitter so as to shift the phase of the voltage applied to each electrode; the third embodiment is characterized by the fact that the DC bias voltages applied to electrodes 4a to 4d are set to the same magnitude and the electrodes are placed in axially symmetric directions with respect to a beam 1 so that an electrostatic force is applied in the torsion direction of the beam 1 of a vibrator, as shown in FIGS. 16(a) and 16(b). That is, the electrodes are placed in the torsion direction relative to the vibrator so as to become equal in distance from the vibrator with torsional vibration of the beam 1 of the vibrator to form electrode pairs. Drive means applies the same AC signal and the same DC bias voltage to the electrode pairs with torsional vibration of the vibrator. Other points are similar to those of the first embodiment described above. Parts identical with those of the first embodiment are denoted by the same reference numerals.

In the third embodiment, the beam 1 is formed as a rod body rectangular in cross section rather than as a paddle. FIG. 16(b) is a sectional view taken on line A-A in FIG. 16(a).

Since the resonator of the embodiment has no projections, the mass added to the vibrator is decreased and it is made possible to convert the resonance frequency into a high frequency. The same phase AC signal and the same DC bias voltage may be applied to the electrodes, so that the drive circuit implementing the drive means is extremely simplified.

Fourth Embodiment

Next, a fourth embodiment of the invention will be discussed.

Figure 17A:
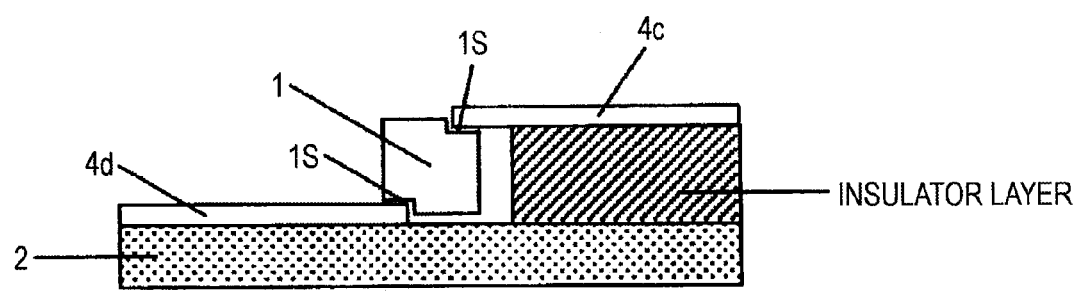
[FIG. 17] A drawing to show a torsional resonator of a fourth embodiment of the invention; (a) is a sectional view and (b) is a drawing to show a modified example in (a).

In the third embodiment described above, the beam 1 is a rod body; in the fourth embodiment, a notch 1S is formed in a portion opposed to each of electrodes 4a to 4d, as shown in FIG. 17(a). Also in the fourth embodiment, applied AC signal phase and DC bias voltage magnitudes may be made the same and the electrodes may be placed in axially symmetric directions with respect to a beam 1 so that an electrostatic force is applied in the torsion direction of the beam, as in the third embodiment. Other points are similar to those of the first embodiment described above. Parts identical with those of the first embodiment are denoted by the same reference numerals.

Although shape working becomes slightly complicated, the resonator can be formed easily using MEMS technology.

Figure 17B:
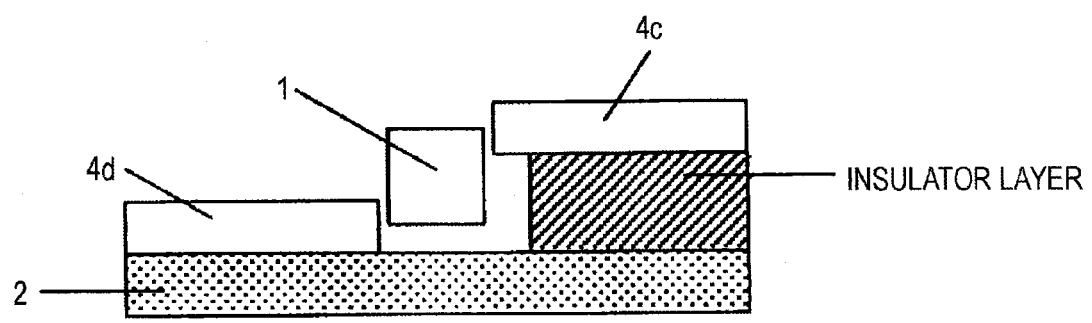

The electrodes 4a to 4d and resonator may be opposed to each other as a modified example is shown in FIG. 17(b).

The resonator in the embodiment of the invention is vacuum-sealed, so that the resonator with a high Q value wherein vibration of the vibrator is not affected by viscosity of air can be provided.

In the embodiment, the clamped-clamped beam is used as the torsional vibrator, but a cantilever rather than the clamped-clamped beam may be used.

Since the resonator shown in the embodiment of the invention has a high capacitive impedance, an appropriate number of resonators may be electrically connected in parallel for lowering the impedance to efficiently transfer the input electric energy to the resonator.

INDUSTRIAL APPLICABILITY

The torsional resonator according to the invention is designed for an electrostatic force to mainly excite an extremely minute structure that can be manufactured according to a semiconductor process and uses torsional resonance with a high Q value and realizes simplicity of the resonance frequency at which flexural vibration other than torsion is excited. Thus, the torsional resonator is useful as a high-frequency filter circuit integrated at a high density, installed in a mobile wireless terminal and the like. It can also be applied to industrial and environmental fields, etc., including spectrum analysis in a voice band and an ultrasonic band, mass analysis using mechanical resonance, etc.

The invention claimed is:

1. A torsional resonator comprising a vibrator for executing mechanical vibration and electrodes positioned close to the vibrator and having an electromechanical conversion function of converting voltage change between the vibrator and the electrodes into vibration of the vibrator,
   wherein the vibrator comprises a beam structure, and
   wherein the torsional resonator comprises a drive unit, which is configured so that an electrostatic force produced due to the potential difference between the electrodes and the vibrator produces a moment with the axis of the beam structure as the center axis, and is configured so as to apply DC bias voltages different in polarity and the same AC signal to an electrode pair of the electrodes, wherein the electrode pair includes one electrode brought away from the vibrator and one electrode brought close to the vibrator with torsional vibration of the vibrator.

2. The torsional resonator according to claim 1, wherein the beam structure comprises a beam comprising projections at axially symmetric positions.

3. The torsional resonator according to claim 1, wherein the beam structure comprises a paddle-like projection.

4. The torsional resonator according to claim 1, further comprising two or more electrode pairs,
   wherein the drive unit switches the polarity of the DC bias voltage applied to at least some electrodes of the electrode pairs, thereby switching torsional resonance between a low-order mode and a high-order mode.

5. The torsional resonator according to claim 1, further comprising a plurality of the torsional resonators having different torsional resonance frequencies and a switch element for selecting at least one of the torsional resonators.

6. The torsional resonator according to claim 1, further comprising a plurality of torsional resonators placed electrically in parallel.

7. The torsional resonator according to claim 1, wherein the torsional resonator is housed in a case in which an atmosphere is sealed in a vacuum.

8. A filter using a torsional resonator according to claim 1.

* * * * *

UNITED STATES PATENT AND TRADEMARK OFFICE
CERTIFICATE OF CORRECTION

PATENT NO. : 7,741,932 B2  Page 1 of 1
APPLICATION NO. : 11/569883
DATED : June 22, 2010
INVENTOR(S) : Nakamura et al.

It is certified that error appears in the above-identified patent and that said Letters Patent is hereby corrected as shown below:

Title page 1, section (74) Attorney, Agent, or Firm, please delete "LLO" and add therefor --LLP--.

Signed and Sealed this

Twenty-eighth Day of September, 2010

David J. Kappos
*Director of the United States Patent and Trademark Office*

UNITED STATES PATENT AND TRADEMARK OFFICE
CERTIFICATE OF CORRECTION

PATENT NO. : 7,741,932 B2
APPLICATION NO. : 11/569883
DATED : June 22, 2010
INVENTOR(S) : Nakamura et al.

It is certified that error appears in the above-identified patent and that said Letters Patent is hereby corrected as shown below:

Title page 1, section (73) Assignee: please add second assignee --Hideki Kawakatsu, Tokyo (JP)--.
Section (73) should read as follows:
(73) Assignee: Panasonic Corporation, Osaka (JP);
Hideki Kawakatsu, Tokyo (JP)

Title page 1, section (74) Attorney, Agent, or Firm, please delete "LLO" and add therefor --LLP--.

Signed and Sealed this
Twenty-ninth Day of March, 2011

David J. Kappos
*Director of the United States Patent and Trademark Office*